US006355572B1

United States Patent
Ikegami

(10) Patent No.: US 6,355,572 B1
(45) Date of Patent: Mar. 12, 2002

(54) METHOD OF DRY ETCHING ORGANIC SOG FILM

(75) Inventor: Naokatsu Ikegami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/519,575

(22) Filed: Mar. 6, 2000

(30) Foreign Application Priority Data

Aug. 31, 1999 (JP) .......................................... 11-245656

(51) Int. Cl.[7] .......................................... H01L 21/302
(52) U.S. Cl. ........................ 438/706; 438/723; 438/725
(58) Field of Search ................................. 438/622, 623, 438/689, 706, 723, 725

(56) References Cited

U.S. PATENT DOCUMENTS

| 5,219,792 A | | 6/1993 | Kim et al. ................... 437/195 |
|---|---|---|---|
| 5,226,056 A | * | 7/1993 | Kikuchi et al. ............... 373/18 |
| 5,413,963 A | | 5/1995 | Yen et al. ................... 437/195 |
| 5,728,630 A | * | 3/1998 | Nishimura et al. .......... 438/763 |
| 5,849,637 A | | 12/1998 | Wang .......................... 438/699 |
| 5,989,998 A | * | 11/1999 | Sugahara et al. ........... 438/623 |
| 6,037,255 A | * | 3/2000 | Hussein et al. ............. 438/675 |
| 6,080,680 A | * | 6/2000 | Lee et al. .................... 438/727 |
| 6,153,511 A | * | 11/2000 | Watatani ..................... 438/623 |
| 6,165,891 A | * | 12/2000 | Chooi et al. ................ 438/622 |
| 6,174,796 B1 | * | 1/2001 | Takagi et al. ............... 438/622 |

* cited by examiner

Primary Examiner—Benjamin L. Utech
Assistant Examiner—Kin-Chan Chen
(74) Attorney, Agent, or Firm—Volentine Francos, PLLC

(57) ABSTRACT

Disclosed herein is a via hole dry etching method using an organic SOG film as an interlayer dielectric having low-K. In the dry etching method, a mixed gas containing at least C4F8 and O2 is used as an etching gas and an O2/(C4F8+O2) mixture ratio is set to 50% or less, thereby to carry out via hole dry etching. Further, the via hole dry etching is carried out by using a mixed gas containing at least CF4, CHF3 and N2 and setting the quantity of flow of N2 to above 10% and below 80% of the quantity of flow of CF4+CHF3+N2.

2 Claims, 3 Drawing Sheets

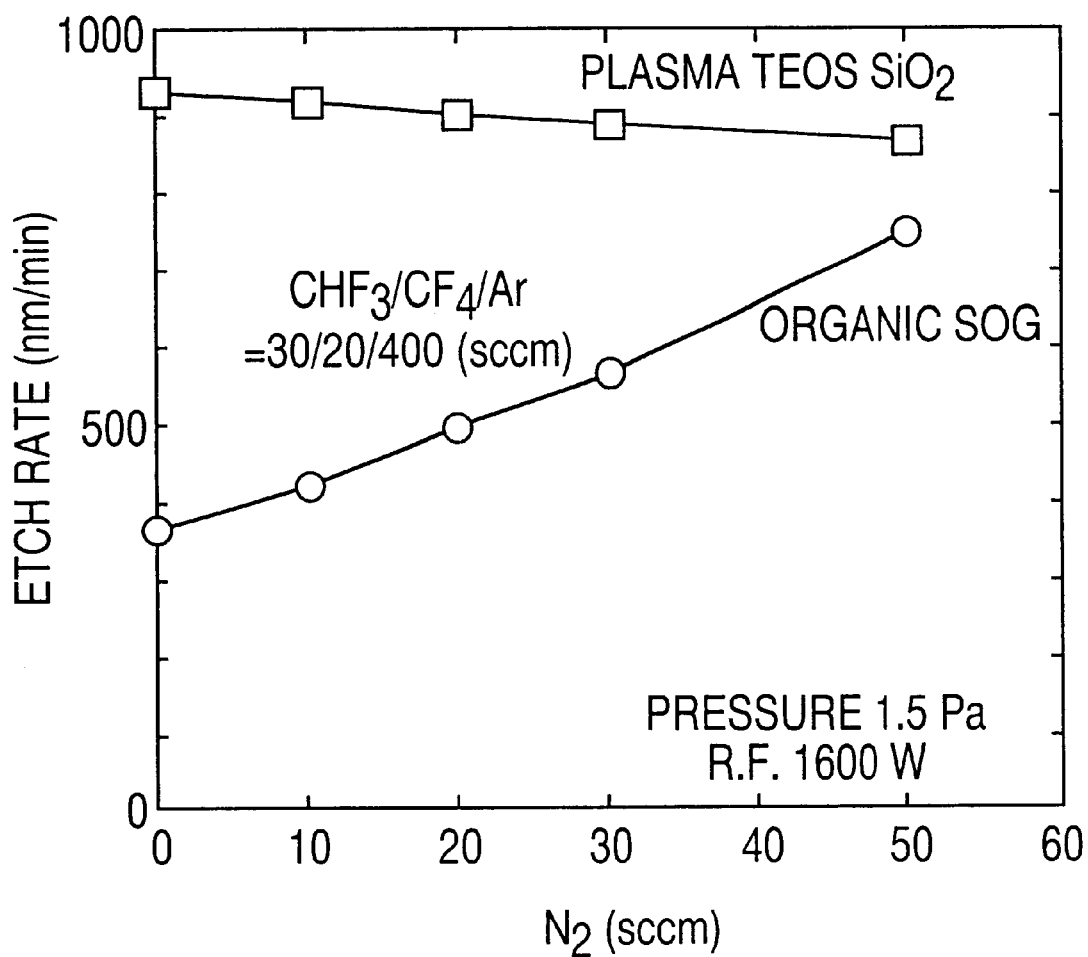

METHOD OF DRY ETCHING ORGANIC SOG FILM

BACKGROUND OF THE INVENTION

1. Field of the Invention

This invention relates to a method of dry etching an organic SOG film used as an interlayer dielectric having low-K (low dielectric constant), which is suitable for use in manufacture of a semiconductor integrated circuit device.

2. Description of the Related Art

With high integration of a semiconductor device centering around recent system and logic LSIs, widths and intervals of metal wires or interconnections have been so narrowed, and interconnections themselves are also becoming so long in length. As a result, the resistance of each interconnection and the capacitance between adjacent interconnections are on the increase, and increases in wiring delay and power consumption due to these have become innegligible. As a method of lessening the influence exerted on device performance with such high integration, there has been proposed a method of introducing a low resistance material such as copper (Cu) as an alternative to the conventionally-used aluminum (Al) wiring material and bringing an insulating film provided between adjacent interconnections into low-K. A study thereof intended for practical use has been promoted.

As to the degree of contribution of a critical path for determining an operating speed (operating frequency) of a device in particular to a delay time, wiring capacitance rather than wiring resistance is expected to increase from the result of simulation. Further, if the wiring capacitance is lowered by a low-K film rather than a reduction in wiring resistance by a Cu interconnection, then the resultant performance is expected to increase by far. A study of an FSG film formed by adding fluorine to an SiO2 film by the conventional chemical vapor deposition (CVD) method, an organic SOG (Spin On Glass) film, an organic film, a porous film, etc. has been carried out actively.

FIG. 1 shows one example of a step in which an organic SOG film formed as a low-K film is used as an interlayer dielectric. In FIG. 1A, a plasma TEOS (Tetraethoxy Silane) oxide film is formed over a lower layer metal interconnection 2 formed over a silicon substrate 1, as a lower layer oxide film 3, followed by deposition of an organic SOG film 4. As an SOG material, may be used, for example, one obtained by dissolving a low-K material composed of an oxide film (SiO2)added with an alkyl group in an organic solvent.

Next, the surface of the organic SOG film is modified by an oxygen O2 plasma treatment. Thereafter, a plasma TEOS oxide film used as a capping oxide film 5 is deposited over the organic SOG film 4. The capping oxide film 5 is used to avoid a problem on peeling of a resist in a photolithography process at the subsequent formation of each via hole. Further, the capping oxide film 5 also acts as a cover film for chemical mechanical polishing (CMP) upon forming interconnections to be embedded into the via hole. The formation of the surface modified layer by the O2 plasma is carried out to prevent film peeling developed between the capping film and the organic SOG film upon execution of the CMP.

Referring next to FIG. 1B, via hole 7 for bringing an upper layer metal interconnection 9 and a lower layer metal interconnection 2 into conduction are formed by using the normal photolithography and dry etching technology. The resultant one is processed under a pressure of a few Pa through the use of a mixed gas of CHF3, CF4 and Ar employed as a general etching condition for an SiO2 film by using, for example, parallel plate reactive ion etching (RIE) equipment as a condition for dry etching. Referring to FIG. 1C subsequently, tungsten plugs 8 each corresponding to a via hole embedding interconnection are formed and thereafter the upper layer interconnection 9 is formed.

However, problems shown below arise when the low-K film such as the aforementioned organic SOG film is introduced into the device. The first problem is that an etch rate at the via hole etching is very slow. The organic SOG film can normally be etched by using a gas plasma for etching the SiO2 film. The organic SOG film is etched by plasma radiation under a pressure of about 1.5 Pa through the use of the CH3/CF4/Ar mixed gas by, for example, the parallel plate RIE equipment as described above.

However, if the etch rate of the organic SOG film is compared with that of, for example, a thermally-grown SiO2 film, then the value thereof is very slow as in the order of ¼. As the device is highly integrated and an aspect ratio (hole depth/hole size) of each via hole increases, such an influence becomes pronounced, so that there may be cases in which a photoresist used as a mask material is not held up due to an increase in etching time in particular.

The second problem is a problem produced in a post-step subsequent to via hole etching. This is principally classified roughly into (a) a problem on a change in the quality of a film upon O2 plasma treatment and (b) a problem on reaction between a WF6 gas and an organic SOG film upon formation of buried tungsten (W). The problem (a) will first be explained. In general, the above-described organic film has the property of becoming weak to heat treatment or annealing in an oxygen plasma atmosphere, and a change (changing into SiO2 form due to densification) in the quality of a film occurs upon O2 plasma treatment for removing the photoresist subsequent to via hole processing.

This is considered to occur due to the fact that an oxygen radical (O*) in a plasma enters into a film from a pattern side-wall of an organic SOG film upon O2 plasma treatment and thereby reacts with an alkyl group (CH3 or the like) in the film under a high temperature. Since a hydrophilic Si—OH group and Si—H group are created in the film by this reaction, it absorbs large quantities of water when subsequently exposed to the air.

Upon introduction of the film into the device, such change in the quality of the film raises problems such as (i) an increase in dielectric constant, (ii) a decrease in film thickness due to degeneration of the film, and (iii) desorption of a large quantity of gases (principally atmospheric components such as H2O, etc.), a failure in embedding due to the desorption, a reduction in yield, etc. upon embedding of (W) into each via hole.

A description will next be made of the problem (b). In order to form a buried W layer after the formation of each via hole, a nitride (TiN) contact layer is normally formed in each hole by a sputtering method and thereafter a W film is deposited thereon by a chemical vapor deposition (CVD) method. The TiN also serves as a protective layer for preventing reaction between WF6 used as a deposition gas upon W burying and an organic SOG side-wall.

As, however, miniaturization or scale-down of a wiring width has progressed with high integration of LSI, a fundamental design rule for allowing each via hole called borderless interconnection to be formed with being deviated from over a bedding interconnection has come into use. In such borderless interconnections, a fine slit is formed between a side-wall of a bedding wiring pattern and a side-wall of each off-defined via hole, so that TiN is not sufficiently buried in the fine slit.

As a result, TiN does not act as the side-wall protective layer, and the WF6 and organic SOG side-wall vigorously react directly with each other upon the subsequent W embedding, thus causing corrosion and W peeling. As a method of solving the problems (a) and (b) referred to above, an approach for performing plasma treatment with an oxygen ion (O+) as a main part after the formation of each via hole is considered.

This is a method of preferentially bombarding a pattern side-wall with the oxygen ion (O+) upon O2 plasma treatment and densifying only an extremely surface layer of the side-wall (making a reform into SiO2), thereby inhibiting the entering of an oxygen radical into a film upon O2 plasma treatment. Since the side-wall modified layer also acts as a protective film for inhibiting reaction between the WF6 gas and organic SOG side-wall upon the subsequent formation of a buried W wiring layer, the corrosion and W peeling are prevented from occurring even if the TiN contact layer is not deposited within the aforementioned fine slit.

However, a problem arise in that when the shape of each pattern is bowed and a metal sputtering material extending from a bed is attached to a side-wall before the O2 plasma treatment (upon via hole etching), the subsequent formation of the side-wall modified layer by the O+ ion impact is made non-uniform so that a sufficient inhibition effect cannot be obtained. When bombarding energy for simply forming the modified layer is applied to the side-wall, a reaction between the O+ ion and the pattern side-wall proceeds to thereby newly bring each via hole into bowing form. Further, another problem arises in that the via hole changes in form due to O+ ion-based sputtering.

SUMMARY OF THE INVENTION

A first invention is constructed so that when each contact hole is formed in an insulating film composed of an organic SOG film by a mixed gas containing at least C4F8 and O2, the quantity of flow or flow rate of O2 at dry etching is set to 50% or less of the quantity of flow of C4F8+O2. As a result, a problem on the speeding up of an etch rate of the organic SOG film and the verticality of the shape, both of which are held in a trade-off relationship to each other, can be solved.

A second invention is constructed so that when each contact hole is formed in an insulating film composed of an organic SOG film by a mixed gas containing at least CF4, CHF3 and N2, the quantity of flow of N2 at dry etching is set to above 10% and below 80% of the total quantity of flow of CF4+CHF3+N2. As a result, the contact hole excellent in shape can be realized.

A third invention is constructed such that each contact hole is defined in an insulating film composed of an organic SOG film by a resist pattern, and plasma treatment for removing the resist pattern subsequent to the formation of the contact hole utilizes a mixed gas of O2+N2H2 or O2+N2+H2. Thus, a problem that an oxygen radical enters into a film from a pattern side-wall to thereby cause changes in film quality and shape, can be solved.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a diagram illustrating N2 partial-pressure dependency of an etch rate at the time that via hole dry etching is carried out by a mixed gas of CF4, CHF3 and N2 in an embodiment of the present invention.

DETAILED DESCRIPTION OF THE INVENTION

Preferred embodiments of the present invention will hereinafter be described in detail with reference to the accompanying drawings.

FIRST EMBODIMENT

Figure 2:
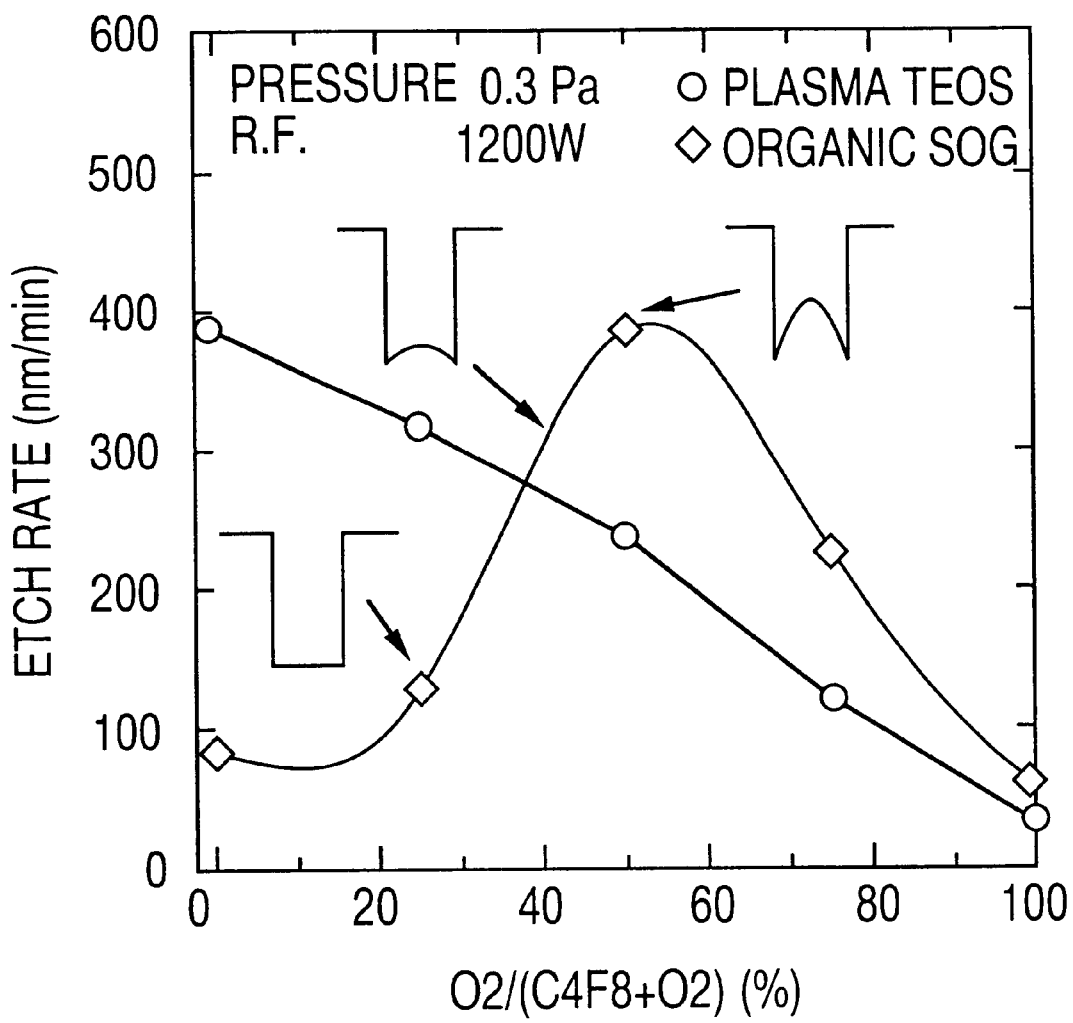
FIG. 2 is a diagram showing O2 partial-pressure dependency of an etch rate at the time that via hole dry etching is performed by a mixed gas containing O2 and C4F8 in an embodiment of the present invention.

FIG. 2 shows changes in etch rate of an organic SOG film where etching is done while using a mixed gas of C4F8/O2/Ar, fixing the ratio of the quantity of flow or flow rate of Ar to the total quantity of flow to 94% and changing a mixture ratio between O2 and C4F8+O2 (C4F8+O2 is represented as 100%). Changes in etch rate of a plasma TEOS SiO2 film are also shown together in the drawing. The shape of each via hole formed in the organic SOG film at the time is also illustrated together in the drawing. A used apparatus is of a magnetron RIE system and has performed etching at a RF power of 1200 W under a pressure of 0.3 Pa.

It is understood from FIG. 2 that the etch rate increases by leaps as the flow rate of a O2 gas in a mixed gas of C4F8+O2 increases, and the etch rate indicates a maximum value at an O2 flow rate of 50%. It is understood that if compared in the absence of O2 addition, then the etch rate at this time reaches about five times thereof. On the other hand, it is understood from the drawing that the etch rate of the plasma TEOS SiO2 film shown for comparison decreases monotonously with an increase in a O2 mixture ratio (this is called simple dilution effect). From this point of view, the above-described O2 addition effect is considered to be a phenomenon peculiar to the organic SOG film and indicates that the O2 gas other than the C4F8 gas is useful as etching species of the organic SOG film.

The mechanism of increase of etch rate by O2 addition is considered to result from the fact that a CH3 group in the organic SOG film considered to inhibit an etching reaction is changed into an SiOH group or an Si—O—Si bond or the like due to attack of an O radical in a plasma, and the formation of these oxidation layers allows an easy progress to the etching reaction by subsequently produced attack of CFx series or the like.

While, however, the increase of the etch rate is promoted by O2 addition, the shape of each via hole is gradually changed into such a shape that the difference between etch rates at the center of a hole called trenching and the end thereof increases (see FIG. 2). Thus, in the present process, a trade-off relationship is kept between the increase of the etch rate and the verticality of the shape. The optimum O2 gas mixture ratio for simultaneously satisfying the two exists in the present process. It was understood from the result of experiments that it was necessary to set the optimum flow rate of the O2 gas for satisfying the two to 50% or less.

SECOND EMBODIMENT

FIG. 3 shows changes in etch rate of an organic SOG film where an N2 gas is added to a mixed gas of CF4/CHF3/Ar (=20/30/40 sccm). Changes in etch rate of a plasma TEOS SiO2 film are also shown together in the drawing. A used apparatus is a parallel plate RIE system and has performed etching at a RF power of 1600 W under a pressure of 1.5 Pa. It is understood from FIG. 3 that the etch rate gradually increases with the amount of addition of N2. It is understood that the etch rate at the time that the amount of addition of N2 is 50 (sccm), reaches about twice the etch rate at the time that no N2 is added.

On the other hand, it is understood from the drawing that the etch rate of the plasma TEOS SiO2 film shown for comparison decreases monotonously with an increase in an N2 mixture ratio (this is called simple dilution effect). From this point of view, the above-described N2 addition effect is considered to be a phenomenon peculiar to the organic SOG film in a manner similar to the addition of O2. A phenomenon in which the etch rate is made faster, is considered to have suggested that an N2 gas other than a CF4/CHF3 gas also takes part in a surface reaction with the organic SOG film owing to the addition of N2 to a fluorocarbon gas in this way.

On the other hand, it was understood that the shape of each via hole formed in the organic SOG film at the addition of N2 to the fluorocarbon gas would not become such a shape (trenching shape) observed upon the addition of O2 that its shape is extremely deteriorated. It was also understood from the result of experiments that the setting of the ratio (N2 flow rate/N2 flow rate+flow rate of fluorocarbon gas) of the N2 gas to the fluorocarbon gas to above 10% and below 80% would become effective.

THIRD EMBODIMENT

Figure 1A:
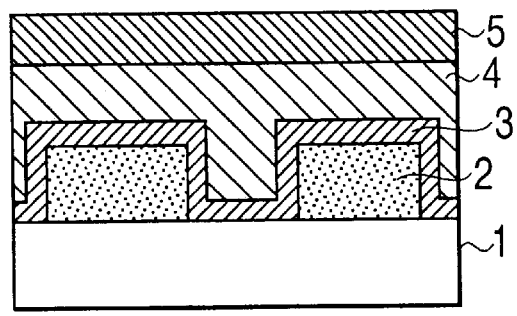
FIGS. 1A through 1C are respectively via hole dry-etching process diagrams for describing a prior art and an embodiment of the present invention.
Figure 1B:
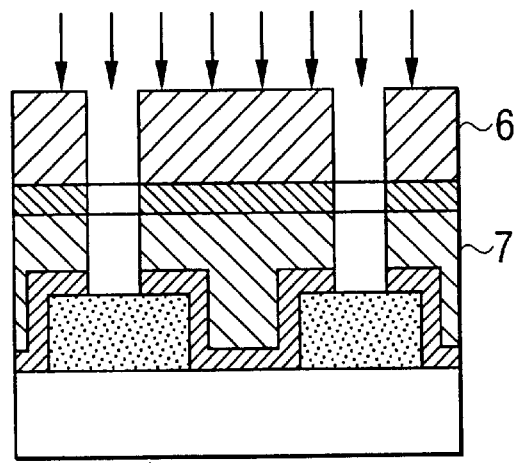
Figure 1C:
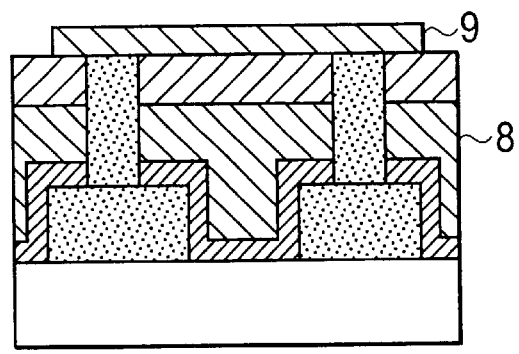

A third embodiment of the present invention will next be explained. Referring to FIG. 1B, a resist is removed by plasma O2 plasma treatment. A mixed gas of O2+N2H2 is used for the plasma treatment employed in the present embodiment, and an apparatus or system makes use of a low-pressure downflow type asher having a system configuration high in ion/radical incoming frequency ratio and wherein ions can be introduced with some degree of directivity and energy. The plasma treatment is done under an plasma treatment pressure of, for example, 0.45 Pa at a temperature of 100° C.

A mixture ratio between O2 and N2H2 is set to, for example, 90%:10%. The plasma treatment is done while a layer (corresponding to a layer which principally reacts with an alkyl group in a film) reacting with N is being formed on an organic SOG side-wall as a side-wall protective layer by using the O2/N2H2 mixed gas. As a result, a problem can be solved that an oxygen radical enters into the film from a pattern side-wall, thereby causing changes in the quality of the film and the shape thereof.

Since the nitride layer (side-wall protective layer) serves so as to inhibit the reaction between a WF6 gas and the organic SOG side-wall at the subsequent formation of buried W interconnections, buried interconnections associated with borderless interconnections can be formed. Further, since the above-described reactive layer is formed only over an extremely surface layer of the organic SOG side-wall by reaction principally with an N radical in a plasma, it is excellent in uniformity as compared with the aforementioned O+ ion irradiation. Further, the change in shape by reaction with the side-wall as in the irradiation with the O+ ions does not occur. Even if a mixed gas of O2/N2/H2 is used, the result exactly similar to the above can be expected.

According to the first invention as has been described above, since the O2 gas is added to the fluorocarbon gas and the gas mixture ratio thereof is set to 50% or less, it was possible to simultaneously satisfy the speeding up of the etch rate and the verticality of the shape, both held in the trade-off relationship. It is thus possible to avoid a problem on throughput at mass production and a problem on resist resistance.

According to the second embodiment as well, since the N2 gas is added to the fluorocarbon gas and the gas mixture ratio thereof is set to above 10% and below 80%, the etch rate can be speeded up while maintaining the vertical and satisfactory shape. It is therefore possible to avoid a problem on throughput at mass production and a problem on resist resistance.

Further, according to the third invention, since the O2+N2H2 mixed gas is used for the plasma treatment subsequent to the etching for the formation of each via hole, it is possible to solve the problem that the layer (protective layer) reacting with N is formed on the side-wall upon plasma treatment and the oxygen radical enters into the film from the pattern side-wall to thereby cause the changes in film quality and shape. Further, the nitride layer (side-wall protective layer) has the function of inhibiting or controlling the reaction between the WF6 gas and the organic SOG side-wall upon the subsequent formation of the buried W interconnections. Furthermore, since the reactive layer is formed only over the extremely surface layer of the organic SOG side-wall by reaction principally with the N radical in the plasma, it is excellent in uniformity.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A dry etching method, comprising:
    etching contact holes in an insulating film composed of an organic SOG film using a resist pattern formed over the insulating layer as a mask, and
    removing the resist pattern by plasma treatment in a gas mixture of $O_2$ and $N_2H_2$.

2. The dry etching method according to claim 1, wherein said organic SOG film is formed by adding an alkyl group to oxide silicon.

* * * * *